United States Patent
Fukaya

(10) Patent No.: US 7,106,084 B2
(45) Date of Patent: Sep. 12, 2006

(54) METHOD OF SCREENING SEMICONDUCTOR DEVICE

(75) Inventor: Kiyohisa Fukaya, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 27 days.

(21) Appl. No.: 10/926,305

(22) Filed: Aug. 26, 2004

(65) Prior Publication Data

US 2005/0064611 A1    Mar. 24, 2005

(30) Foreign Application Priority Data

Sep. 4, 2003    (JP)    ............................. 2003-312560

(51) Int. Cl.
*G01R 31/26*    (2006.01)

(52) U.S. Cl. ...................................... 324/765; 324/752

(58) Field of Classification Search ..................... None
See application file for complete search history.

(56) References Cited

U.S. PATENT DOCUMENTS

| | | | | | |
|---|---|---|---|---|---|
| 4,281,449 | A | * | 8/1981 | Ports et al. | 29/593 |
| 5,519,334 | A | * | 5/1996 | Dawson | 324/765 |
| 6,119,255 | A | * | 9/2000 | Akram | 714/724 |
| 6,525,555 | B1 | * | 2/2003 | Khandros et al. | 324/765 |
| 6,933,527 | B1 | * | 8/2005 | Isobe et al. | 257/59 |

FOREIGN PATENT DOCUMENTS

JP    6029301    2/1994

* cited by examiner

*Primary Examiner*—Ernest Karlsen
*Assistant Examiner*—Richard Isla-Rodas
(74) *Attorney, Agent, or Firm*—Takeuchi&Kubotera, LLP

(57) ABSTRACT

A method of screening a semiconductor device comprises the steps of successively forming a gate insulation film (102) and a conductive film (104) on a silicon wafer (100) to provide a structure (106) and bringing the first voltage application terminal (110) into contact with the back of the structure and the second voltage application terminal (112) having a potential different from that of the first voltage application terminal (110) into contact with the surface of the conductive film (104) to thereby apply a stress voltage to the structure (106).

3 Claims, 3 Drawing Sheets

METHOD OF SCREENING SEMICONDUCTOR DEVICE

BACKGROUND OF THE INVENTION

1. Field of the Invention

The present invention relates to a method of screening a semiconductor device and, particularly, to a method of screening a semiconductor device by applying a stress voltage.

2. Description of the Related Art

The screening of an initial defect due to the gate oxide film or the p-n junction formed in the semiconductor layer has been performed for the semiconductor chip and the packaged semiconductor device after the wafer process completion. In the screening of a semiconductor chip, a stress voltage is applied to the bonding pad formed on the semiconductor chip by contacting a terminal contacting needle. For the packaged semiconductor device, a stress voltage is applied to the external lead terminal via a socket. Upon application of a stress voltage, a precision equipment, such as an LSI tester or burn-in equipment, is used.

The application of a stress voltage reveals a latent defect so that the semiconductor device with an initial defect is removed, thus reducing the initial malfunction rate after shipping.

Japanese Patent Application Kokai No. 6-29301 has proposed a method of shortening the burn-in time of a packaged semiconductor device by applying a stress voltage before conducting the functional test of a completed semiconductor chip for checking if there is an error in the data outputted from the operation of logic and memory patterns.

In the above voltage application method, however, it is necessary to make a stress application by the operation of a circuit function because a stress voltage is applied to all the elements of a semiconductor device for screening the semiconductor chip and package. Especially when a complicated circuit structure is included in the semiconductor chip and package, a prolonged screening is necessary for applying a stress voltage to all the regions of a semiconductor device due to the circuit operation timing shift. Also, it is necessary to bring the terminal contact needle into contact with the bonding pad of a semiconductor chip with high precision for the voltage application. Similarly, a stress voltage is applied to the outer lead terminal of the semiconductor package via a socket. This requires an expensive facility for the prolonged use of an LSI tester or burn-in equipment.

Thus, there has been a demand for an economical method of screening a semiconductor device that shortens the stress voltage application time for making a latent defect visible.

SUMMARY OF THE INVENTION

According to the invention there is provided a method of screening a semiconductor, which includes the step of applying a stress voltage to make a latent defect visible, comprising the steps of forming a gate insulation film on a wafer and then a conductive film on the gate insulation film to provide a structure having the wafer, the gate insulation film, and the conductive film and bringing the first voltage application terminal connected to the first electrode terminal of a voltage application source into contact with the back of the wafer and the second voltage application terminal connected to the second electrode terminal having a potential different from that of the first electrode terminal to thereby apply a stress voltage to the structure.

With the screening method, a stress voltage is applied during the wafer process to make a latent defect visible so that it is unnecessary to make a prolonged burn-in operation with precision and expensive equipment such as an LSI tester or burn-in equipment

DESCRIPTION OF THE PREFERRED EMBODIMENTS

Embodiments of the invention will now be described with reference to the accompanying drawings.

First Embodiment

Figure 1A:
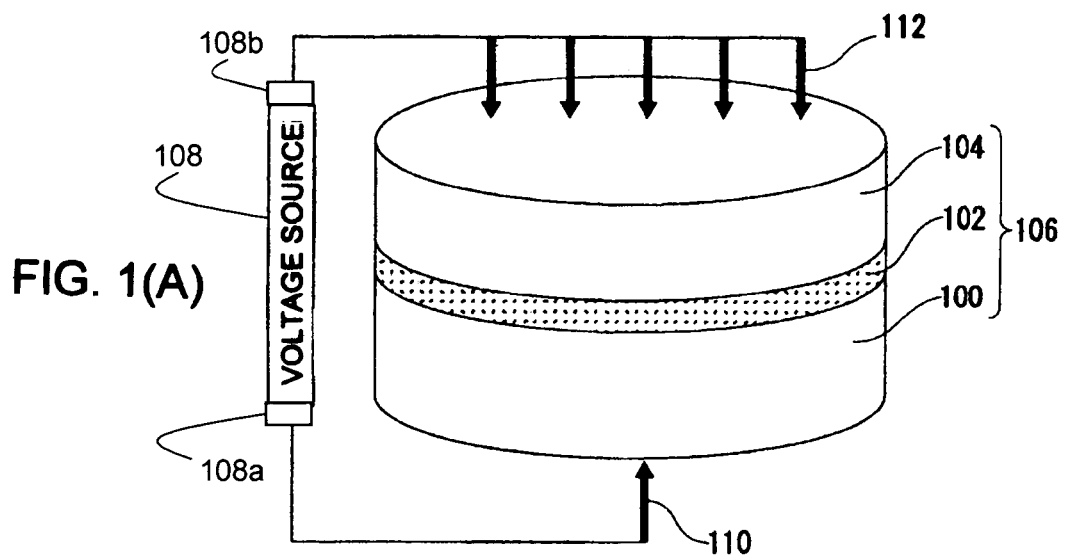
FIG. 1(A) is a perspective view of a structure to which a stress voltage is applied with a plurality of second voltage application terminals according to the first embodiment of the invention.

In FIG. 1(A), a gate insulation film 102 is formed on a silicon wafer 100. For example, the silicon oxide film is formed by the thermal oxidation process. Then, a conductive film 104 is formed on the gate insulation film 102. For example, a polysilicon film is formed for the conductive film 102, providing a structure 106 that is composed of the silicon wafer 100, the gate insulation film 102, and the conductive film 104. The conductive film 104 is subjected to patterning after the stress voltage application in the wafer process to provide a gate electrode.

Then, the first voltage application terminal 110 connected to the first electrode terminal 108a of the voltage application source 108 is brought into contact with the back of the wafer of the structure 106 and, then, the second voltage application terminal 112 connected to the second electrode terminal 108b that has a potential different from that of the first electrode terminal is brought into contact with the top face of the conductive film 104 to thereby apply a stress voltage.

If the potentials at the first and second electrode terminals are Vcc and Vss, respectively, the stress voltage is the potential difference between Vcc and Vss. The stress voltage has an absolute value that is greater than the voltage applied for the use of the semiconductor device. For example, it is preferred that the stress voltage is set at approx. +5 V for a use voltage of +3 V.

Also, it is preferred that the temperature for application of a stress voltage ranges from 85 to 125 degree C. This is the common burn-in temperature range. The upper limit has been about 125 degree C. due to the thermal breakdown of the terminal of a burn-in equipment but, according to the invention, the voltage application terminal is very simple and has a high thermal resistance so that it is possible to apply a stress voltage at higher temperatures. The stress voltage application at a temperature higher than 125 degree C. shortens the time for making a latent defect visible so that it is possible to shorten the stress voltage application time.

A plurality of the second voltage application terminals 112 may be provided. The potential can decrease with the distance from the point where the voltage application terminal contacts so that the stress voltage application with a plurality of voltage application terminals assures more uniform voltage application. In FIG. 1(A), five second voltage application terminals are shown.

Figure 1B:
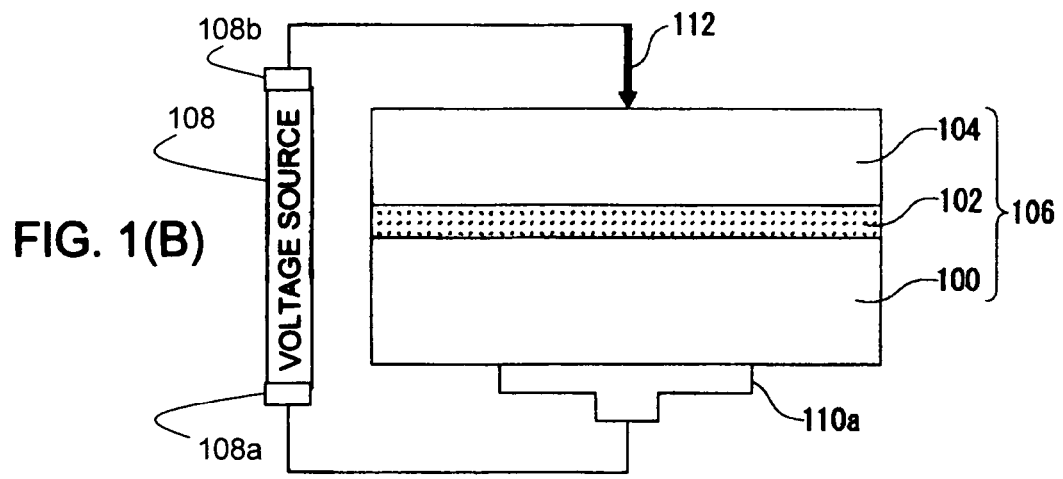
FIG. 1(B) is a side view of a structure supported by a support section according to a variation to the first embodiment of the invention.

In FIG. 1(B), the first voltage application terminal 110 is replaced by a support section 110a that fixes the silicon wafer. The support section 110a contacts with the wide area of the back of the wafer so that the electrical field distribution becomes uniform, resulting in the uniform application of a stress voltage.

The stress voltage application during the wafer process makes a latent defect visible. Consequently, a defective product can be checked early in the semiconductor chip checking process after the wafer process. In addition, since the stress voltage has been applied, the burn-in time is shortened for screening the initial breakdown of a semiconductor device to be shipped.

A device separation local oxidation (LOCOS) or shallow trench isolation (STI) oxide film, or a well region may be formed on the silicon wafer 100 on which the gate isolation film is formed. The silicon wafer may be replaced by a wafer of a compound semiconductor such as GaAs.

By the screening method according to the invention, a stress voltage is applied during the wafer process, making a latent defect visible. Consequently, it is unnecessary to make a prolonged burn-in with precision and expensive equipment such as an LSI tester or burn-in equipment.

Second Embodiment

Similarly to the first embodiment, the gate insulation film 102 and the conductive film 104 are formed on the silicon wafer 100 to provide a structure 106. Then, the gate insulation film 102 and the conductive film 104 are etched by the well known photolitho etching technology to form dividing grooves 116 with which the gate insulation film 102 and the conductive film 104 are divided into a plurality of divided areas 114a–114f. Each divided area is composed of a gate insulation film and a conductive film. In this embodiment, five parallel linear dividing grooves 116 are formed to provide six divided areas 114a–114f. The dividing grooves 116 may not be linear. How to make dividing grooves 116 not to cut the gate electrode will be described later.

Then, a stress voltage is applied to each of the divided areas 114a–114f by bringing the first voltage application terminal 110 into contact with the back face of the silicon wafer 100 and the second voltage application terminal 112 into contact with the top face of the divided area 114a or conductive layer 104a. Similarly, a stress voltage is applied sequentially to the divided areas 114b–114f by means of the first and second voltage application terminals 110 and 112. The values of a stress voltage and temperature at which the stress voltage is applied are the same as those of the first embodiment.

By applying stress voltages to the divided areas 114a–114f in this way, it is possible to apply a stress voltage to the entire wafer even if there is a defect in a part of the wafer. The value of a stress voltage can be set for each divided area so that it is useful to apply to a part of the areas a stress voltage that is different from those of the other areas. A plurality of stress voltages may be applied to a plurality of divided areas at the same time. In this case, it is necessary to provide the voltage application sources and the second voltage application terminals of the same number as the number of divided areas to which stress voltages are applied simultaneously.

Figure 2A:
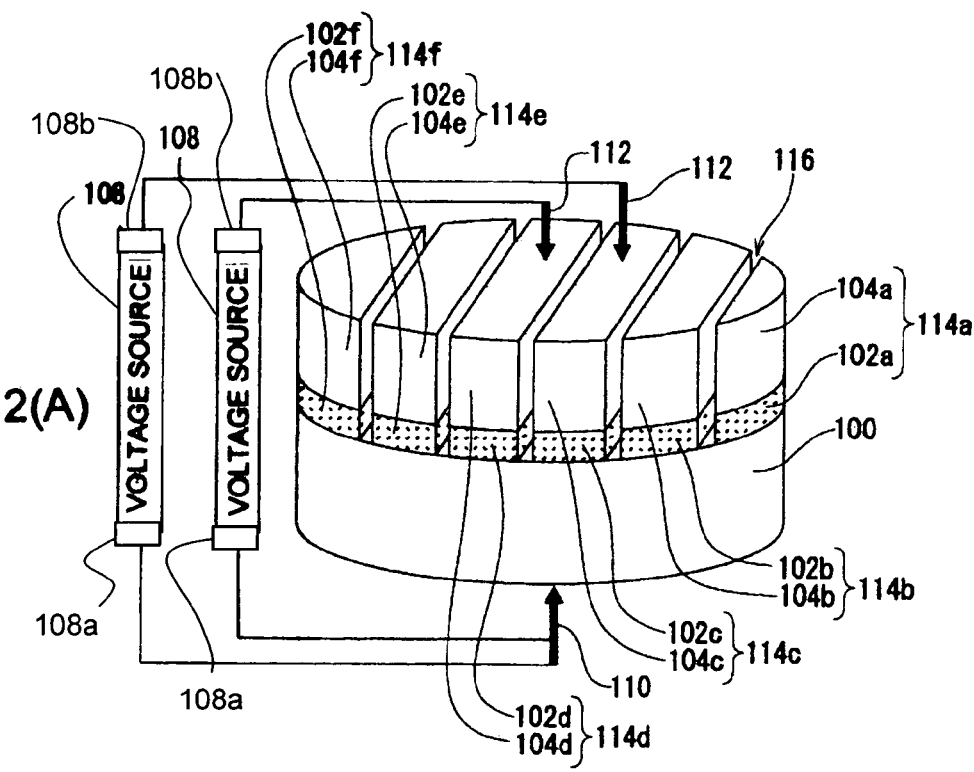
FIG. 2(A) is a perspective view of a structure with six divided areas according to the second embodiment of the invention.
Figure 2B:
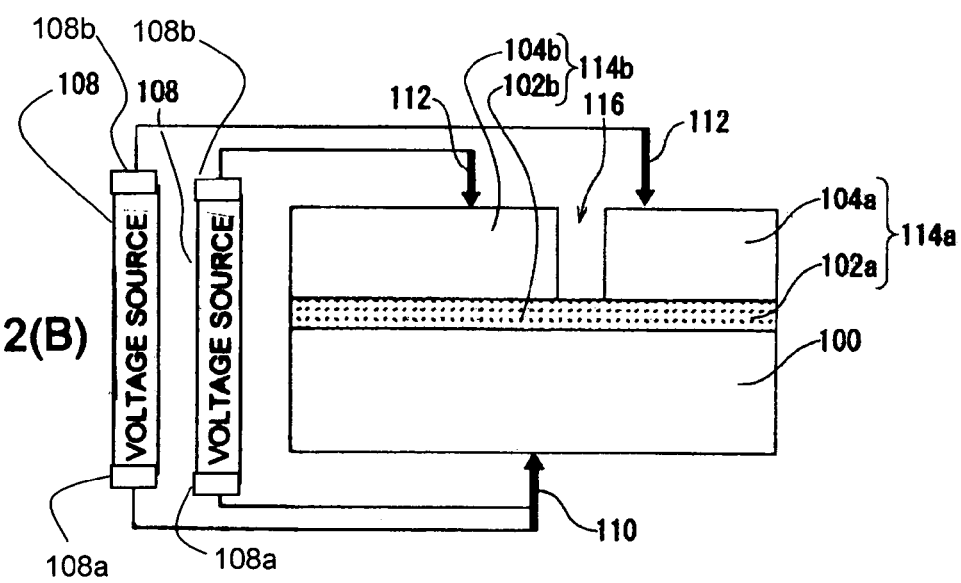
FIG. 2(B) is a side view of a structure with two divided areas according to a variation to the second embodiment of the invention.

In FIG. 2(B), two divided areas 114a and 114b are supplied with stress voltages simultaneously by means of two voltage application sources 108. If the standard potential Vss is the ground potential GND, the first voltage application terminal can be used commonly so that a plurality of voltage application sources may be connected to a single first voltage application terminal. By using a plurality of voltage application sources 108 and a plurality of second voltage application terminals 112 to apply stress voltages to a plurality of divided areas, it is possible to shorten the stress voltage application time.

The formation pattern of the dividing grooves 116 will be described. The dividing grooves 116 are provided linearly and in parallel as viewed from above. The dividing grooves 116 are formed by etching the gate insulation film 102 and the conductive film 104 so that it is desired that they do not overlap the gate electrode regions of a semiconductor chip. To do this, the scribing lines for cutting a semiconductor wafer into individual chips may be used.

Figure 3:
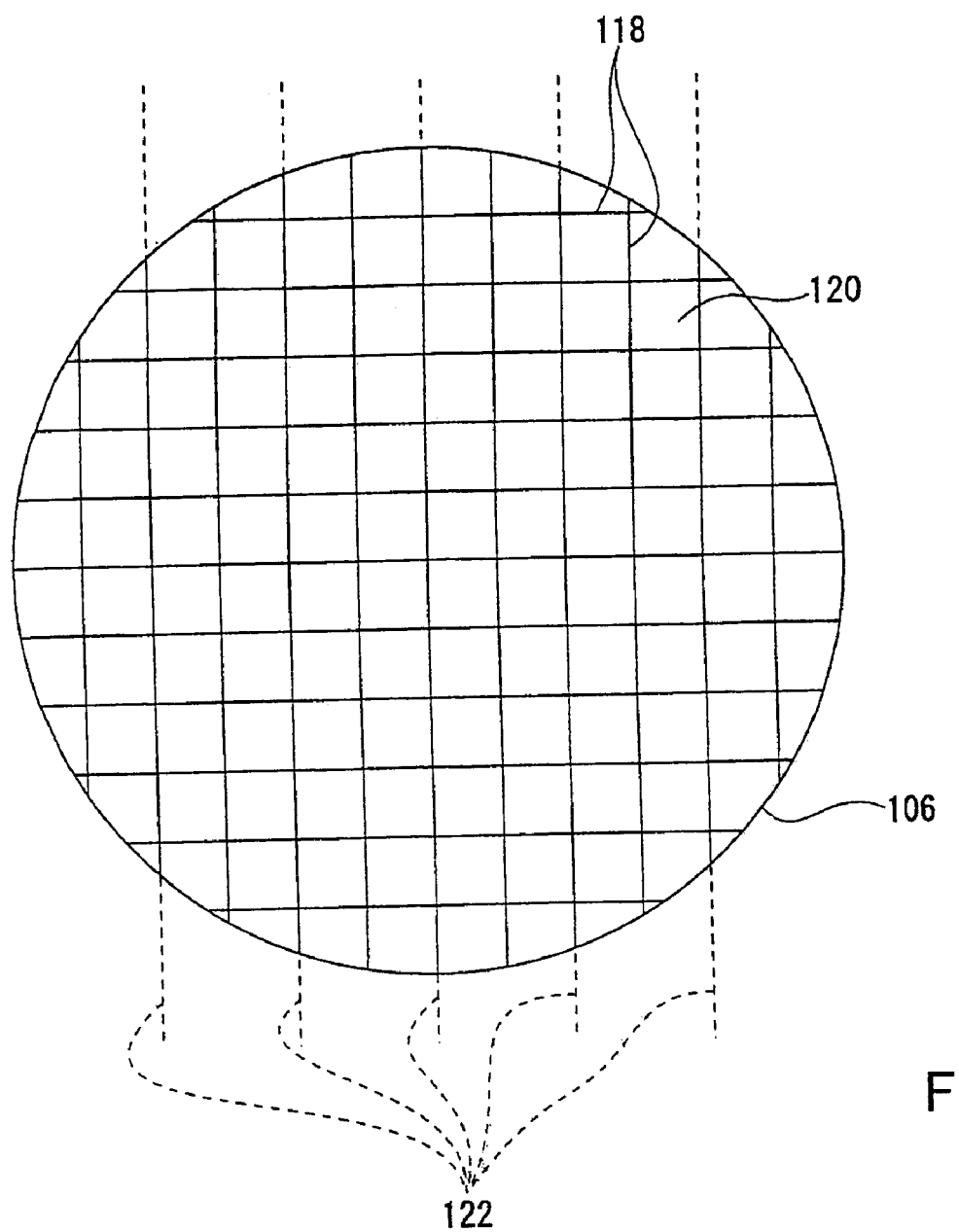
FIG. 3 is a top plan view of a structure with five dividing groove forming regions according to the second embodiment of the invention.

In FIG. 3, scribing lines 118 are provided in the wafer surface, providing a grid shaped pattern. Each semiconductor chip 120 is provided by cutting along the surrounding scribing lines 118 so that no gate electrode is formed on the scribing lines. Consequently, when dividing groove forming regions 122 are provided on the scribing lines 118 as shown by five phantom lines, no gate electrode is cut by the dividing groove 116. By forming dividing grooves 116 in the dividing groove forming regions 122, it is possible to form divided areas 114a–114f without cutting any gate electrode. A plurality of semiconductor chips are included in a single divided area so that it is possible to apply stress voltages to the plurality of semiconductor chips at the same time.

The method according to the invention is useful for screening to enhance the reliability of a semiconductor device.

The invention claimed is:

1. A screening method, in which a stress voltage is applied to a semiconductor to make a latent defect visible, comprising the steps of:
    forming a gate insulation film on a wafer;
    forming a conductive film on said gate insulation film to provide a structure having said wafer, said gate insulation film, and said conductive film;
    etching said gate insulation film and said conductive film to provide a plurality of divided areas;
    bringing a first voltage application terminal connected to a first electrode terminal of a voltage application source into contact with a back face of said wafer; and
    bringing a second voltage application terminal connected to a second electrode terminal having a potential different from that of said first electrode terminal into contact with a surface of said conductive film to thereby apply the stress voltage to each of said divided areas.

2. The screening method according to claim 1, wherein, in the step of bringing the second electrode terminal, the second electrode terminal sequentially contacts with the surface of the conductive film in each of the divided areas so that said stress voltage is sequentially applied to each of said divided areas.

3. The screening method according to claim 1, wherein, in the step of bringing the second electrode terminal, the second electrode terminals simultaneously contact with the surface of the conductive film in each of the divided areas so that said stress voltage is simultaneously applied to a plurality of said divided areas.

* * * * *